United States Patent
Guyette et al.

(10) Patent No.: US 10,056,662 B2
(45) Date of Patent: Aug. 21, 2018

(54) SWITCHED BANDSTOP FILTER WITH LOW-LOSS LINEAR-PHASE BYPASS STATE

(71) Applicant: The United States of America, as represented by the Secretary of the Navy, Washington, DC (US)

(72) Inventors: Andrew C. Guyette, San Mateo, CA (US); Eric J. Naglich, Alexandria, VA (US); Sanghoon Shin, Burke, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 60 days.

(21) Appl. No.: 15/275,159

(22) Filed: Sep. 23, 2016

(65) Prior Publication Data
US 2017/0085241 A1    Mar. 23, 2017

Related U.S. Application Data

(60) Provisional application No. 62/222,751, filed on Sep. 23, 2015.

(51) Int. Cl.
| | |
|---|---|
| *H01P 1/20* | (2006.01) |
| *H01F 38/14* | (2006.01) |
| *H01P 1/10* | (2006.01) |
| *H01P 1/12* | (2006.01) |
| *H03H 7/12* | (2006.01) |
| *H01P 1/203* | (2006.01) |
| *H03H 7/01* | (2006.01) |

(52) U.S. Cl.
CPC .............. *H01P 1/20* (2013.01); *H01F 38/14* (2013.01); *H01P 1/10* (2013.01); *H01P 1/127* (2013.01); *H01P 1/2039* (2013.01); *H03H 7/12* (2013.01); *H03H 2007/013* (2013.01)

(58) Field of Classification Search
CPC ......... H01P 1/10; H01P 1/127; H03H 7/0115; H03H 2007/013; H03H 7/12; H04B 3/04
USPC .................................. 333/175, 176, 204, 205
See application file for complete search history.

(56) References Cited

U.S. PATENT DOCUMENTS

| | | | | |
|---|---|---|---|---|
| 5,298,873 | A * | 3/1994 | Ala-Kojola | ............... H01P 7/04 333/202 |
| 5,541,560 | A * | 7/1996 | Turunen | ............... H01P 1/2056 333/134 |
| 8,665,040 | B1 | 3/2014 | Chappell et al. | |
| 8,963,737 | B2 * | 2/2015 | Makdissi | ................. H04B 1/22 333/133 |
| 2002/0196878 | A1 * | 12/2002 | Dick | ....................... H03D 3/06 375/346 |

(Continued)

OTHER PUBLICATIONS

International Search Report and Written Opinion for PCT/US2016/053557 from the International Searching Authority, dated Jan. 5, 2017.

*Primary Examiner* — Rakesh Patel
(74) *Attorney, Agent, or Firm* — US Naval Research Laboratory; William P. Ladd

(57) ABSTRACT

Systems and methods are provided for implementing a switched microwave bandstop filter with minimum insertion loss and phase distortion in the bypass state. For example, embodiments of the present disclosure provide systems and methods for implementing self-switching bandstop filters that do not require signal-routing RF switches, allowing for very low passband insertion loss and improved power handling.

20 Claims, 11 Drawing Sheets

(56) References Cited

U.S. PATENT DOCUMENTS

| | | | |
|---|---|---|---|
| 2009/0115555 A1* | 5/2009 | Kim .................... | H01P 1/20336 333/205 |
| 2009/0128260 A1 | 5/2009 | Block et al. | |
| 2013/0271346 A1 | 10/2013 | Dussopt et al. | |
| 2014/0247098 A1 | 9/2014 | Kim et al. | |
| 2014/0327495 A1 | 11/2014 | He et al. | |

* cited by examiner

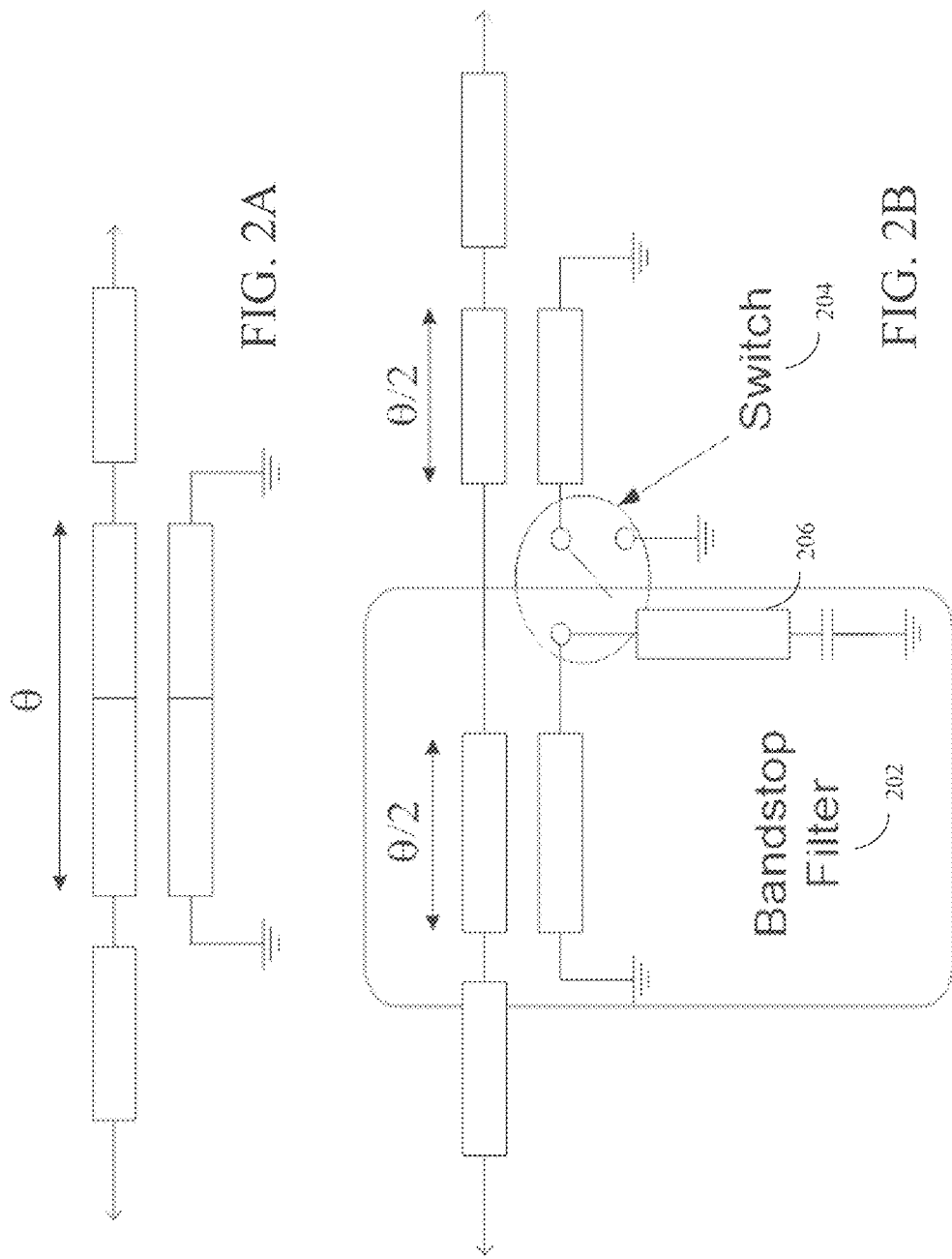

SWITCHED BANDSTOP FILTER WITH LOW-LOSS LINEAR-PHASE BYPASS STATE

CROSS REFERENCE TO RELATED APPLICATIONS

This application claims the benefit of U.S. Provisional Patent Application No. 62/222,751, filed on Sep. 23, 2015, which is incorporated by reference herein in its entirety.

FIELD OF THE DISCLOSURE

This disclosure relates to filters, including bandstop filters.

BACKGROUND

Bandstop filters are used in microwave systems to remove unwanted signals over a specific frequency range while passing signals with frequencies that fall outside of that range. Microwave bandstop filters can be used to reflect or absorb unwanted signals in a microwave system. These unwanted signals can originate from co-site or externally generated interference as well as nonlinear components under high-power excitation in the system. For example, a traditional microwave bandstop filter can be composed of resonators coupled to a through line with quarter-wavelength admittance inverters between each resonator. This bandstop filter topology can produce a symmetric notch frequency response and meet a wide variety of practical specifications. However, when the traditional microwave bandstop filter topology is used for high-order filters, the total through-line length becomes long.

Switched bandstop filters implement a reconfigurable frequency response at the front-end of an RF system that allows it to receive or reject a specific frequency band on demand. The conventional switched-bandstop-filter configuration is comprised of switches in conjunction with a bandstop filter and bypass transmission line in parallel. The switches route an RF signal to the internal direct path for all-pass mode or to the filter path to engage the bandstop filter. In this approach, the RF signal experiences significant insertion loss from the switches.

In the case of reconfigurable or frequency-agile systems, it is often a requirement that each bandstop filter have bypass capability. Using two signal-routing radio frequency (RF) switches for every bandstop filter typically results in considerable insertion loss when multiple switched filters are cascaded due to the losses of the switches.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings:

FIG. 2A is a diagram showing an all-pass network using parallel transmission lines;

FIG. 2B is a diagram of an all-pass network in accordance with an embodiment of the present disclosure;

Figure 1A:
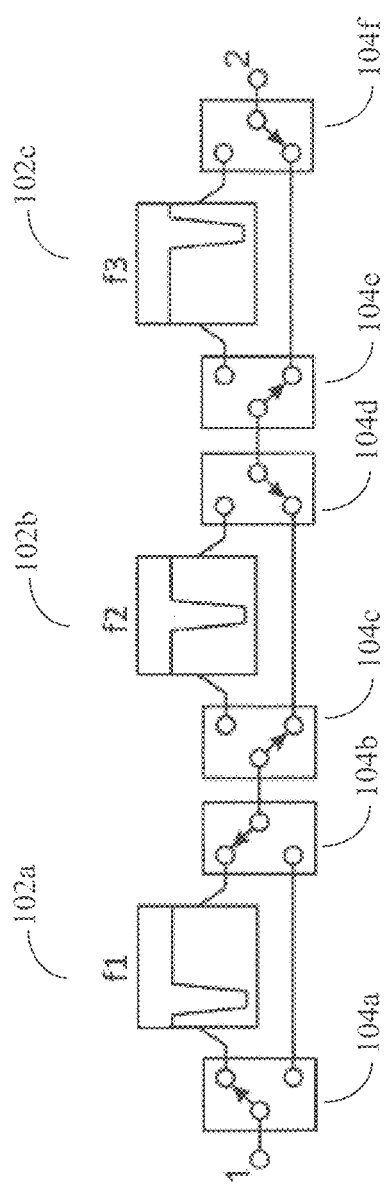
FIG. 1A is a diagram of a conventional bypass approach that uses two signal-routing RF switches for every bandstop filter.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include one of software, or firmware, or hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component Donning apart of the module. Conversely, multiple modules described herein can represent a single component within an actual device. Further, components within a module can be in a single device or distributed among multiple devices in a wired or wireless manner.

1. Overview

In this disclosure, systems and methods are provided to minimize additional insertion loss from switches using all-pass networks in conjunction with SPDT (Single-Pole-Double-Throw) switches. In contrast to conventional switched bandstop filters, the switches in the proposed structure are located outside of the main signal path. Therefore the transmitted signal does not go through the switching network directly, and the proposed configuration drastically reduces the insertion loss compared with conventional switchable filters. It also minimizes the discrepancy in passband group delay between all-pass mode and bandstop filter mode without supplemental lengths of transmission line, which is only possible in conventional multi-path type switchable filter designs by increasing size.

Embodiments of the present disclosure provide systems and methods for implementing a switched microwave bandstop filter with minimum insertion loss and phase distortion in the bypass state. For example, embodiments of the present disclosure provide systems and methods for implementing self-switching bandstop filters that do not require signal-routing RF switches, allowing for very low passband insertion loss and improved power handling.

2. Switched Bandstop Filter Topologies

Bandstop filters can be used in microwave systems to excise unwanted signals. In the case of reconfigurable or frequency-agile systems, it is often a requirement that each bandstop filter have bypass capability. FIG. 1A is a diagram of a conventional bypass approach that uses two signal-routing RF switches 104 for every bandstop filter 102, which typically results in considerable insertion loss when multiple switched filters are cascaded due to the losses of the switches.

Figure 1B:
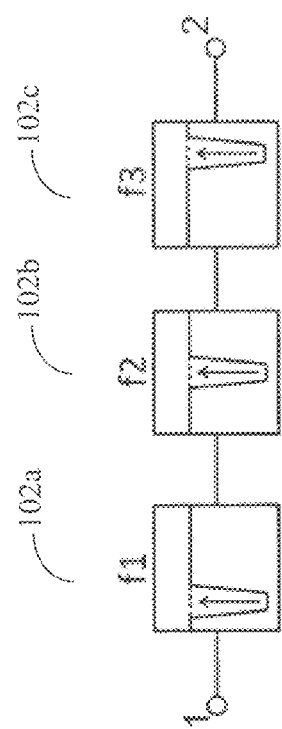
FIG. 1B is a diagram of a coupling approach according to an embodiment of the present disclosure.
Figure 1C:
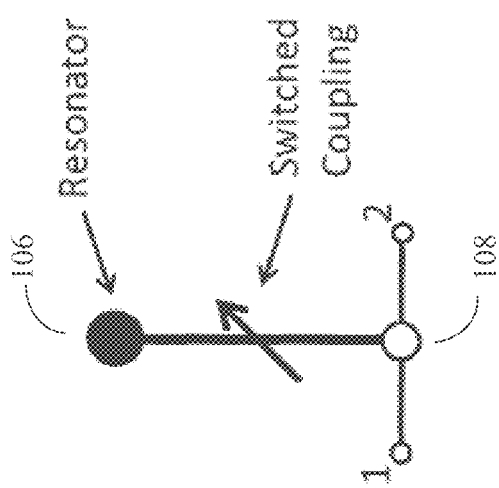
FIG. 1C is a coupling diagram showing an exemplary first order bandstop section.

FIG. 1B is a diagram of a coupling approach according to an embodiment of the present disclosure, which provides systems and methods for implementing self-switching bandstop filters that do not require signal-routing RF switches 104, allowing for very low passband insertion loss and improved power handling. In an embodiment, the self-switching bandstop filter topology of FIG. 1B cancels a coupling between an electromagnetic resonator and a transmission line. FIG. 1C is a coupling diagram showing an exemplary first order bandstop section, comprised of a resonator 106 coupled to a node 108 via a switched coupling.

In contrast to conventional approaches, the switches in embodiments of the present disclosure are located outside of the main signal path. Therefore, the transmitted signal does not go through the switching network directly, and the proposed configuration drastically reduces the insertion loss compared with conventional switchable filters. It also minimizes the discrepancy in passband group delay between all-pass mode and bandstop filter mode without supplemental lengths of transmission line.

FIG. 2A is a diagram showing an all-pass network using parallel transmission lines. A through line is parallel coupled with a transmission line in which both end sections are terminated with grounds. In this configuration, the magnetic and electric couplings are balanced along the coupled lines and all frequencies pass though the through line without any interruptions over ideally infinite bandwidth. FIG. 2B is a diagram of an all-pass network in accordance with an embodiment of the present disclosure. If the coupled line section is split into two symmetric sections and a shunt series bandstop resonator is added in the middle of the grounded coupled line as shown in FIG. 2B, the all-pass response from the modified coupled line is still maintained due to the balanced couplings from the symmetric structure. However, if the balanced couplings between coupled lines are broken by a switch located in the middle of the grounded coupled lines, the circuit is no longer an all-pass network. Then the coupled line section loaded with a shunt series resonator behaves as a bandstop filter 202 as shown in FIG. 2B. For this purpose a switch 204 is inserted in the middle of the all-pass coupled line sections, and a bandstop resonator 206 is attached in the middle of the coupled line sections in shunt. When the switch is set to connect the two coupled line sections, the all-pass state results, and a bandstop filter response does not appear as long as the coupling from both coupled line sections cancels.

However, when the switch is in the bandstop mode, then the coupling balance between the two coupled line sections is broken, and the coupled line resonator behaves as a bandstop resonator. In the bandstop mode, the right-hand side coupled line section individually has an all-pass-mode coupled-line configuration because the switch connects its left side to ground, and it is used as part of the required phase shift between resonators for impedance matching in high-order bandstop filter design.

Another advantage of this approach is less discrepancy of the passband group delay between all-pass mode and bandstop filter mode. In the case of conventional switched bandstop filter design, there are often different path lengths for each switching mode to minimize size. The group delay responses are therefore different for each mode. However, in an embodiment of the present disclosure, only one path exists between all-pass and notch filter modes, which results in the same delay for two different modes in system design.

Figure 3:
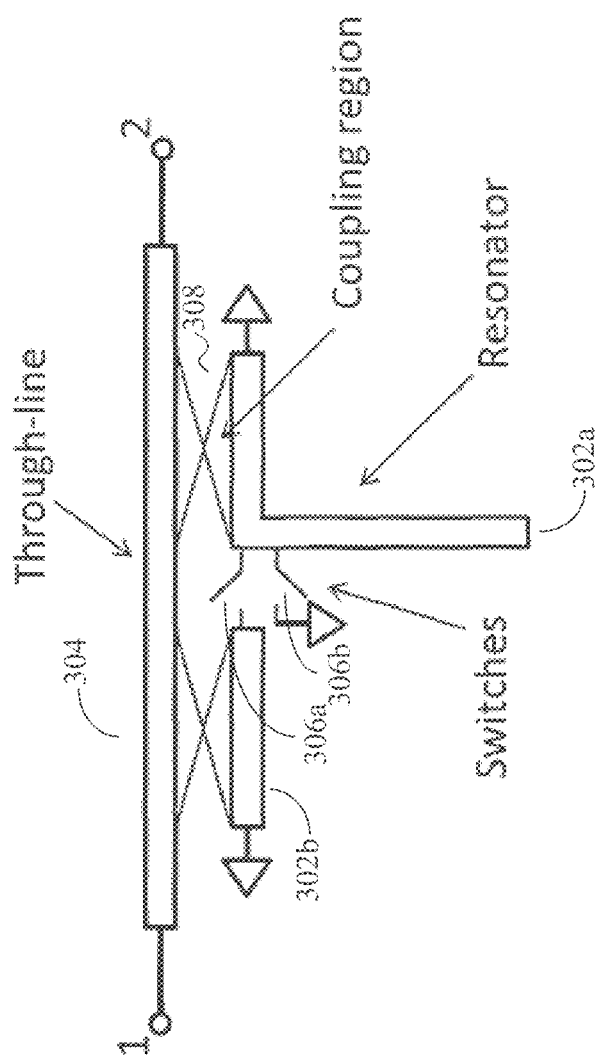
FIG. 3 is a diagram showing an exemplary implementation of an embodiment of the present disclosure using a combline-type resonator inductively coupled to a transmission line.

FIG. 3 is a diagram showing another exemplary implementation of an embodiment of the present disclosure using a resonator (e.g., a combline-type resonator) inductively coupled to a transmission line. In FIG. 3, a resonator 302a is coupled to a transmission line 304 with predominantly magnetic coupling 308. A first RF switch 306a (e.g., a single pole, single throw (SPST) RF switch) is used to switch in another magnetically-coupled resonator section 302b, which has the effect of cancelling out the magnetic coupling 308. A second RF switch 306b is used to short out the remaining small amount of electric coupling. While two switches 306 are shown in the embodiment of FIG. 3, it should be understood that a single switch embodiment can also be used, e.g., as shown in FIG. 2B.

When switches 306 are in the off state, resonator 302a is coupled to transmission line 304, and a first order bandstop response results. In an embodiment, the effect of switches 306 on the unloaded Q (Qu) of resonator 302a is minimized, as the open state-loss performance of most switch technologies is superior to the on-state performance. The inductive cancellation scheme according to embodiments of the present disclosure does not require a long through-line as required in previous approaches. In an embodiment, the minimum through-line length is limited by the maximum coupling per unit length achievable for the coupled-line sections and is dependent on the transmission line technology used (e.g. microstrip, suspended-stripline, coaxial, etc.

Figure 4:
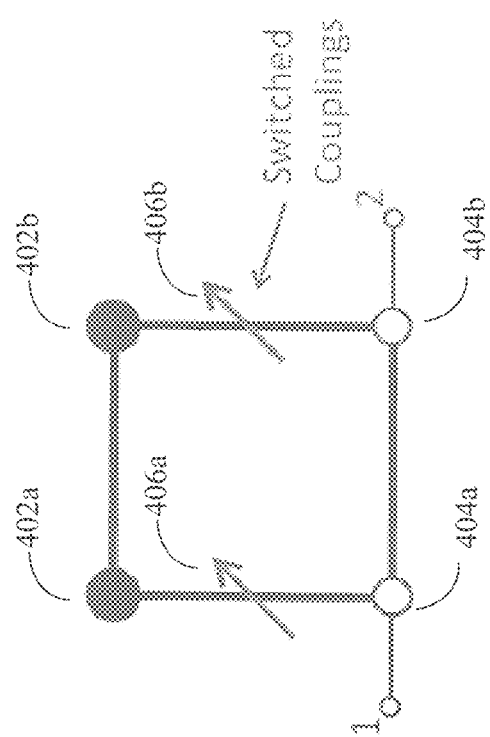
FIG. 4 is a coupling diagram of a second order switched absorptive bandstop filter including two resonators coupled to two nodes in accordance with an embodiment of the present disclosure.

FIG. 4 is a coupling diagram of a second order switched absorptive bandstop filter including two resonators 402 coupled 406 to two nodes 404 in accordance with an embodiment of the present disclosure. In an embodiment, when the resonator-to-through-line couplings are switched on, the transmission response is equivalent to that of a first order reflective bandstop filter, while the reflection response is matched at all frequencies including the stopband.

Figure 5A:
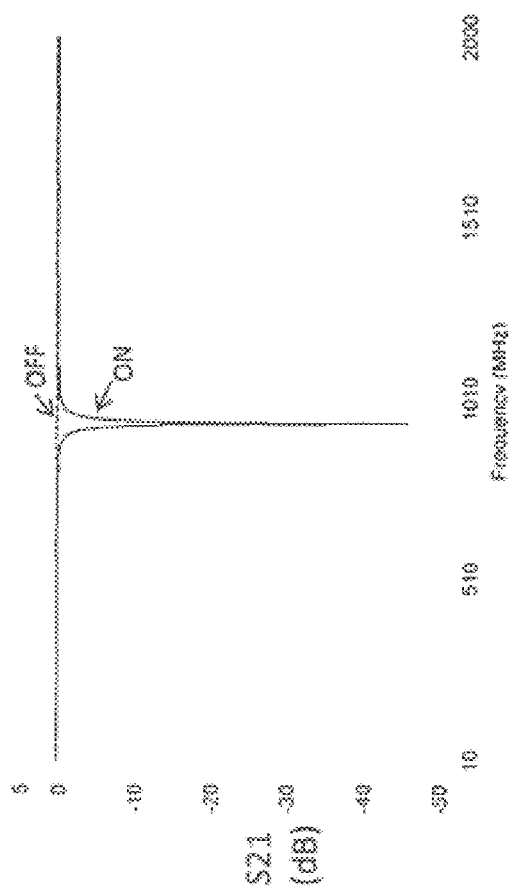
FIG. 5A is a diagram showing measured S-band parameters of an exemplary implementation of a circuit in accordance with an embodiment of the present disclosure.
Figure 5B:
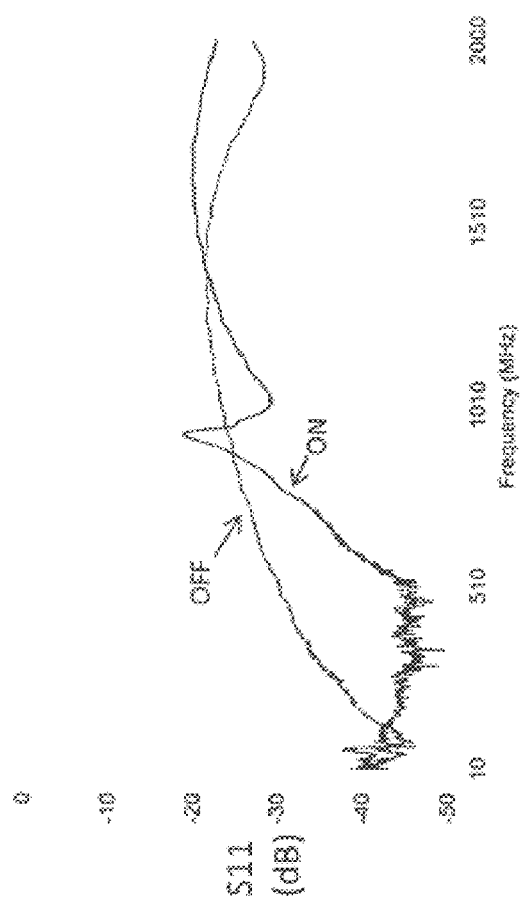
FIG. 5B is another diagram showing measured S-band parameters of an exemplary implementation of a circuit in accordance with an embodiment of the present disclosure.

FIGS. 5A and 5B show measured S-band parameters of an exemplary implementation of a circuit based on the diagram of FIG. 4. FIG. 5A is a diagram showing transmission of 0.22 dB in the passband of both on and off states. FIG. 5B is a diagram showing reflection of <−19 dB for both on and off states.

3. Exemplary Embodiments

Figure 6:
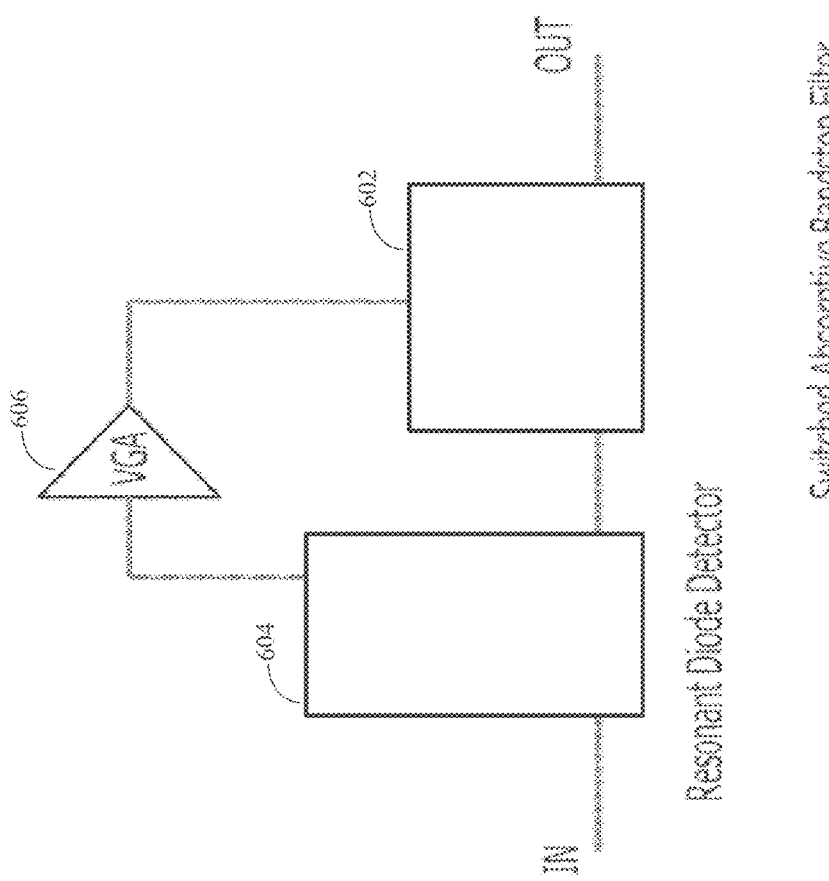
FIG. 6 is a diagram showing a switched absorptive bandstop filter coupled to a resonant diode detector in accordance with an embodiment of the present disclosure.

FIG. 6 is a diagram showing a switched absorptive bandstop filter 602 coupled to a resonant diode detector 604 in accordance with an embodiment of the present disclosure. In an embodiment, resonant diode detector 604 is a weakly-coupled bandstop resonator with an integrated detector diode and is tuned to the same center frequency as switched absorptive bandstop filter 602. In an embodiment, resonant diode detector 604 has a negligible effect on insertion loss and linearity.

In an embodiment, a variable gain amplifier (VGA) 606 is used to couple resonant diode detector 604 to switched absorptive bandstop filter 602. In an embodiment VGA 606 allows an activation threshold to be adjusted. For example, without VGA 606, the threshold is +7 dBm, and with VGA 606, the minimum threshold is −20 dBm.

Figure 7:
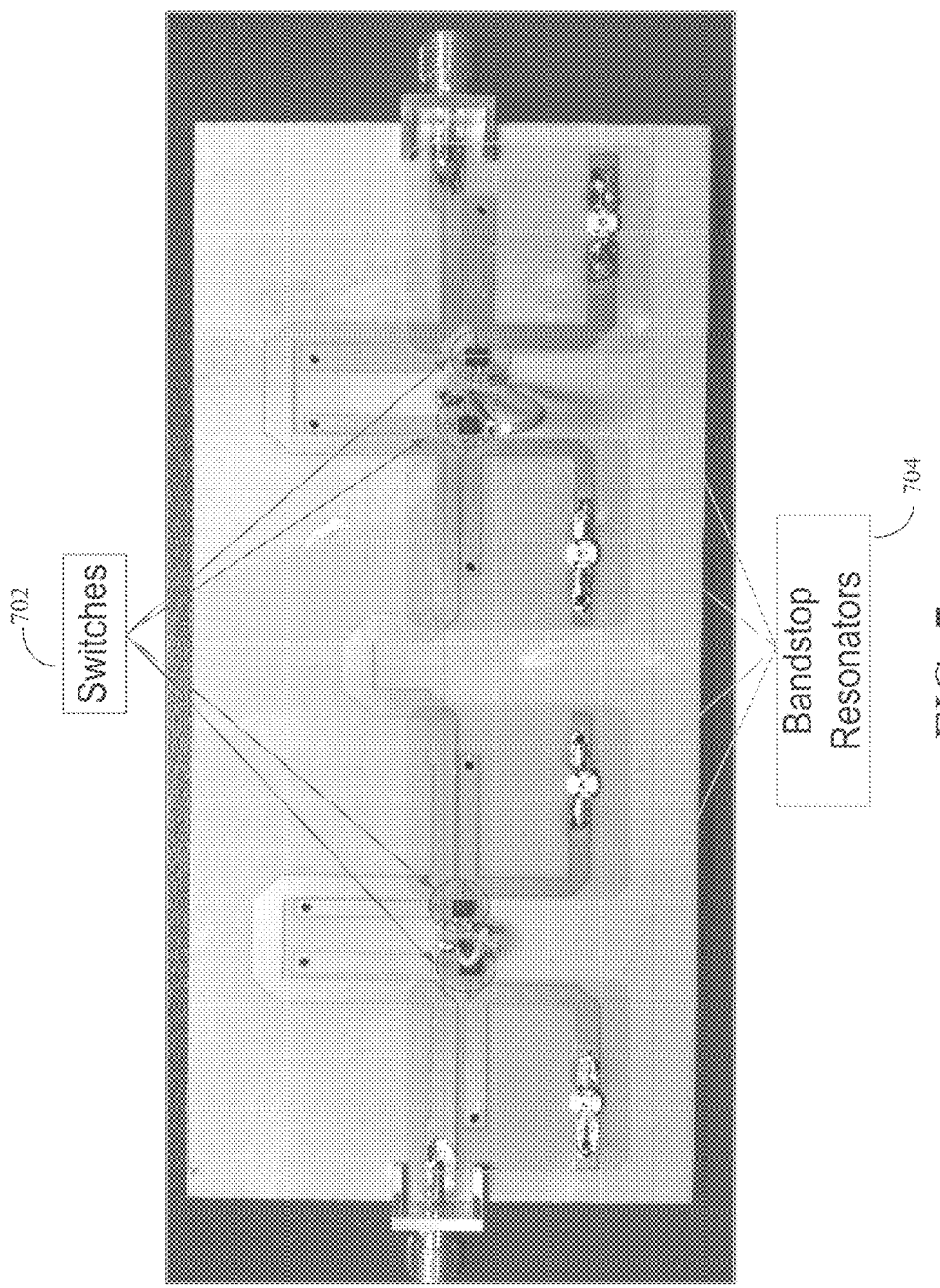
FIG. 7 is a diagram of an exemplary 4-pole Chebychev notch filter in accordance with an embodiment of the present disclosure.

FIG. 7 is a diagram of an exemplary 4-pole Chebychev notch filter in accordance with an embodiment of the present disclosure having switches 702 and bandstop resonators 704. In the embodiment of FIG. 7, a length of line was added between resonator sections so that the total length between resonators, including the lengths of the double-grounded coupled line sections, was approximately 90 degrees.

4. Exemplary Method for Switching a Bandstop Filter

Figure 8:
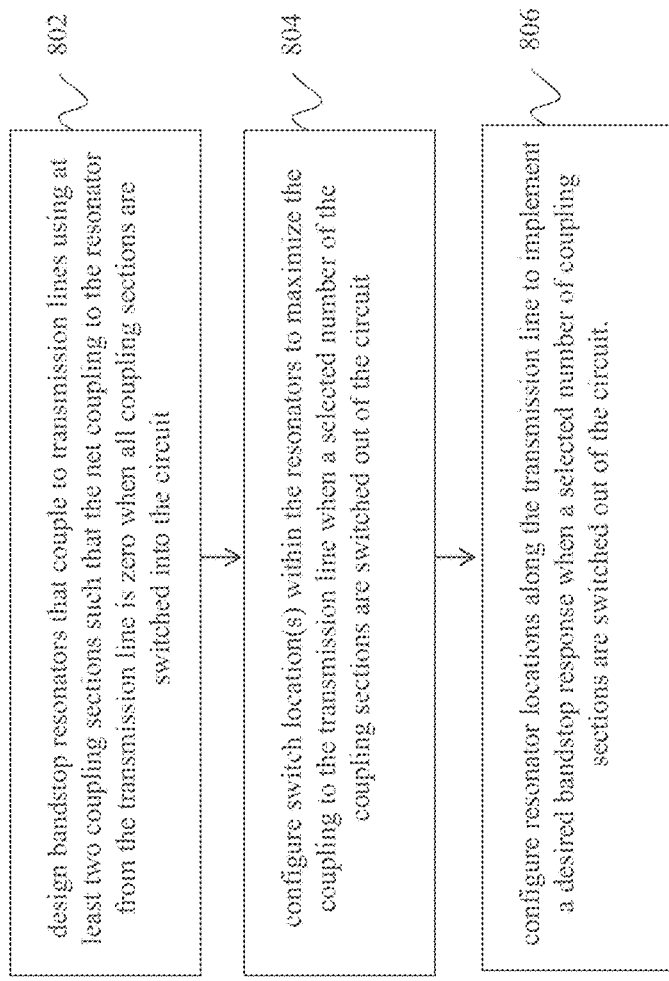
FIG. 8 is a flowchart of an exemplary method for switching a bandstop filter response into and out of the front-end response of a system in accordance with an embodiment of the present disclosure.

FIG. 8 is a flowchart of an exemplary method for switching a bandstop filter response into and out of the front-end response of a system in accordance with an embodiment of the present disclosure. In step 802, bandstop resonators are designed such that they couple to transmission lines using at least two coupling sections and such that the net coupling to the resonator from the transmission line is zero when all coupling sections are switched into the circuit. In step 804, switch location(s) are configured within the resonators to maximize the coupling to the transmission line when a selected number of the coupling sections are switched out of the circuit. In step 806, resonator locations are configured along the transmission line to implement a desired bandstop response when a selected number of coupling sections are switched out of the circuit.

5. Advantages and Alternatives

A switched bandstop filter in accordance with an embodiment of the present disclosure has several advantages over competing technologies. For example, in an embodiment, a switched bandstop filter in accordance with an embodiment of the present disclosure has no added insertion loss from the signal-routing RF switches. Additionally, there is significantly less through-line length required by the inductive coupling-cancellation structure than by previous approaches, resulting in lower insertion loss and smaller size. Further, in accordance with an embodiment of the present disclosure, the off state is a non-resonant allpass, and so does not suffer from the residual insertion loss and phase distortion that results from a resonant allpass response. Additionally, higher operating RF power levels can be achieved for a given switching element in accordance with an embodiment of the present disclosure. Also, in the case of absorptive realizations, switching the filter does not disturb the Voltage Standing Wave Ratio (VSWR), which can be important especially in receiver applications where an interferer can be removed without reflecting energy back out through the antenna.

In an embodiment, a switched bandstop filter in accordance with an embodiment of the present disclosure is comprised of distributed elements and lumped elements, which could potentially be realized with a wide range of technologies (e.g. waveguide, coaxial, LTCC, etc.). In an embodiment, a wide range of switches (PIN diodes, FET, BJT, MEMS, phase-change materials, etc.) could be used to implement the RF switches.

6. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Any representative signal processing functions described herein can be implemented using computer processors, computer logic, application specific integrated circuits (ASIC), digital signal processors, etc., as will be understood by those skilled in the art based on the discussion given herein. Accordingly, any processor that performs the signal processing functions described herein is within the scope and spirit of the present disclosure.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g., software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A self-switching bandstop filter, comprising:
a first resonator coupled to a transmission line wherein the transmission line is grounded at both ends thereof;
a second resonator coupled to the transmission line; and
a switch configured to couple the second resonator to the first resonator, wherein the switch is configured to cancel a magnetic coupling between the first resonator and the transmission line when the switch is closed.

2. The self-switching bandstop filter of claim 1, wherein the first resonator is a combline-type resonator.

3. The self-switching bandstop filter of claim 1, wherein the first resonator is magnetically coupled to the transmission line.

4. The self-switching bandstop filter of claim 1, wherein the self-switching bandstop filter operates in a bandstop mode when the switch is open.

5. The self-switching bandstop filter of claim 1, wherein the switch is configured to cancel an electric coupling between the first resonator and the second resonator when the switch is open.

6. The self-switching bandstop filter of claim 1, wherein a first order bandstop response results when the switch is open.

7. The self-switching bandstop filter of claim 1, further comprising:
a resonant diode detector.

8. The self-switching bandstop filter of claim 7, wherein the resonant diode detector is a weakly-coupled bandstop resonator with an integrated detector diode.

9. The self-switching bandstop filter of claim 7, wherein the resonant diode detector is tuned to a center frequency of the self-switching bandstop filter.

10. The self-switching bandstop filter of claim 7, further comprising:
a variable gain amplifier coupled to the resonant diode detector, wherein the variable gain amplifier is configured to enable an activation threshold to be adjusted.

11. The self-switching bandstop filter of claim 1, wherein the self-switching bandstop filter operates in an all-pass mode when the switch is closed.

12. A self-switching bandstop filter, comprising:
a first transmission line; and
a second transmission line coupled to the first transmission line, wherein the second transmission line is grounded at both ends thereof, wherein the second transmission line comprises:
a first portion comprising a shunt series resonator coupled to ground, and
a second portion comprising a switch configured to couple the first portion to the second portion, wherein the series shunt resonator behaves as a bandstop resonator when the switch is in a bandstop mode.

13. The self-switching bandstop filter of claim 12, wherein an all-pass state results when the switch couples the first portion to the second portion.

14. The self-switching bandstop filter of claim 12, wherein the switch is a single-pole-double-throw (SPDT) switch.

15. The self-switching bandstop filter of claim 12, wherein, in the bandstop mode, the second portion individually has an all-pass mode coupled line configuration, and the switch couples the second portion to ground.

16. The self-switching bandstop filter of claim 12, wherein the second transmission line is magnetically coupled to the first transmission line.

17. The self-switching bandstop filter of claim 12, further comprising:
a resonant diode detector.

18. The self-switching bandstop filter of claim 17, wherein the resonant diode detector is a weakly-coupled bandstop resonator with an integrated detector diode.

19. The self-switching bandstop filter of claim 17, further comprising:
a variable gain amplifier coupled to the resonant diode detector, wherein the variable gain amplifier is configured to enable an activation threshold to be adjusted.

20. A method for switching a bandstop filter response into and out of a front-end response of a system, the method comprising:
designing bandstop resonators of a circuit that couple to transmission lines of the system using at least two coupling sections, such that a net coupling of the bandstop resonators to the transmission lines is zero when all coupling sections are switched into the circuit;
configuring switch locations within the bandstop resonators to maximize the coupling to the transmission line when a selected number of the coupling sections are switched out of the circuit; and
configuring resonator locations along the transmission line to implement a desired bandstop response when a selected number of coupling sections are switched out of the circuit.

* * * * *